US008044677B2

(12) United States Patent
Cremonesi et al.

(10) Patent No.: US 8,044,677 B2
(45) Date of Patent: Oct. 25, 2011

(54) ELECTRICAL SYSTEM, VOLTAGE REFERENCE GENERATION CIRCUIT, AND CALIBRATION METHOD OF THE CIRCUIT

(75) Inventors: Giovanni Cremonesi, Fiorenzuola d'Arda (IT); Sandro Rossi, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 96 days.

(21) Appl. No.: 12/340,110

(22) Filed: Dec. 19, 2008

(65) Prior Publication Data

US 2010/0156519 A1 Jun. 24, 2010

(51) Int. Cl.
*G01R 31/02* (2006.01)
*G01R 31/00* (2006.01)
*G01R 21/02* (2006.01)

(52) U.S. Cl. ............... 324/762.01; 324/750.03; 324/105

(58) Field of Classification Search .................. 324/105, 324/158.1, 760, 765; 327/524; 374/1
See application file for complete search history.

(56) References Cited

U.S. PATENT DOCUMENTS

| | | | | |
|---|---|---|---|---|
| 5,309,090 | A * | 5/1994 | Lipp | 324/750.03 |
| 5,319,370 | A * | 6/1994 | Signore et al. | 341/120 |
| 5,440,305 | A | 8/1995 | Signore et al. | |
| 5,790,469 | A * | 8/1998 | Wong | 365/226 |
| 6,789,533 | B1 * | 9/2004 | Hashimoto et al. | 123/672 |
| 7,148,763 | B2 * | 12/2006 | Sutardja | 331/176 |
| 7,233,163 | B2 * | 6/2007 | Krishnamoorthy et al. | 324/762.02 |
| 7,433,790 | B2 | 10/2008 | Anderson et al. | |
| 7,696,768 | B2 * | 4/2010 | Greenberg et al. | 324/760 |
| 2007/0176617 | A1 * | 8/2007 | Kuwana et al. | 324/760 |

* cited by examiner

*Primary Examiner* — Huy Q Phan
*Assistant Examiner* — Joshua Benitez
(74) *Attorney, Agent, or Firm* — Lisa K. Jorgenson; Timothy L. Boller; Seed IP Law Group PLLC

(57) ABSTRACT

A voltage generation circuit that includes: a voltage generator integrated in a semiconductor chip and structured to generate an output voltage in accordance with a calibration parameter; a heater operable to heat the voltage generator; a control device configured to receive the output voltage, activate the heater and provide the calibration parameter to the voltage generator.

37 Claims, 7 Drawing Sheets

ELECTRICAL SYSTEM, VOLTAGE REFERENCE GENERATION CIRCUIT, AND CALIBRATION METHOD OF THE CIRCUIT

BACKGROUND

1. Technical Field

The present disclosure relates to the field of voltage reference generators and, particularly, to the band-gap voltage reference circuits.

2. Description of the Related Art

As it is known, many electrical circuits employ a voltage reference circuit, which should exhibit little dependence on supply and process parameters and a well defined temperature behavior. A known reference generator technique is the band-gap reference which balances a negative temperature coefficient of a pn junction with a positive temperature coefficient of the thermal voltage, $V_{th}=k_BT/q$, where $k_B$ is the Boltzmann's constant and q the electron's charge. Typically, the two terms having opposite temperature behaviors are the voltage base-emitter $V_{be}$ of a BJT (bipolar junction transistor) and the difference $\Delta V_{be}$ between two bipolar transistors. The generated voltage $V_{bg}$ can be expressed as:

$$V_{bg}=K_1V_{be}+K_2\Delta V_{be}$$

wherein factors $K_1$ and $K_2$ represent ratio of resistors included in the voltage reference circuit, having the same temperature behavior.

It has been observed that many second order effects cause variation of the derivatives of $V_{be}$ and $\Delta V_{be}$. Consequently, the temperature variations of the two terms indicated in the expression above are still linear, but their second order derivatives have a variable temperature behavior. This situation produces a voltage versus temperature curve (volts/° C.) showing a parabolic behavior as the one exemplary depicted in FIG. 8.

Moreover, the statistical dispersion of silicon parameters during the manufacturing process causes a dependence of the temperature which can be different for each manufactured circuit. Therefore, it is necessary to calibrate a voltage reference circuit. In accordance with known techniques, the calibration occurs during a particular manufacturing step or, after the manufacturing process, in a testing step. The calibration consists in modifying both or one of the factors $K_1$ and $K_2$. The Applicants note that this type of calibration increases the costs of the manufacturing process and does not take into account the performance losses occurring during the circuit life.

Document U.S. Pat. No. 7,433,790 describes a circuit provided with a logic block performing a test algorithm to control trimming of a reference value generating circuit and a temperature measurement system.

Document U.S. Pat. No. 5,440,305 discloses an apparatus for calibration of errors in a monolithic reference including a band-gap voltage reference. Moreover, this document describes a calibration operation in which a temperature measuring system and a burn-in oven are employed and a calculation to determine compensation factors is performed.

BRIEF SUMMARY

According to an embodiment, a voltage reference generation circuit comprises:

a voltage generator integrated in a semiconductor chip and structured to generate an output voltage in accordance with a calibration parameter;

a heater operable to heat said voltage generator;

a control device configured to receive said output voltage, activate said heater and provide said calibration parameter to the voltage generator.

According to another aspect, a calibration method comprises:

providing a voltage reference generator integrated in a semiconductor chip and structured to generate output voltages in accordance with corresponding calibration parameters;

providing a heater integrated in the semiconductor chip and configured to adjust operating temperature of at least part of the voltage generator;

evaluating a first voltage value assumed by the output voltage generated at a first temperature and at a first calibration parameter;

evaluating a second voltage value of the output voltage generated at a second temperature and at the first calibration parameter;

comparing said first and second voltages to evaluate if the first calibration parameter satisfies a calibration criteria.

A further embodiment includes an electronic system comprising an electronic device and a voltage reference generator circuit.

BRIEF DESCRIPTION OF THE SEVERAL VIEWS OF THE DRAWINGS

Further characteristics and advantages will be more apparent from the following description of a preferred embodiment and of its alternatives given as a way of an example with reference to the enclosed drawings in which.

DETAILED DESCRIPTION

Figure 1:
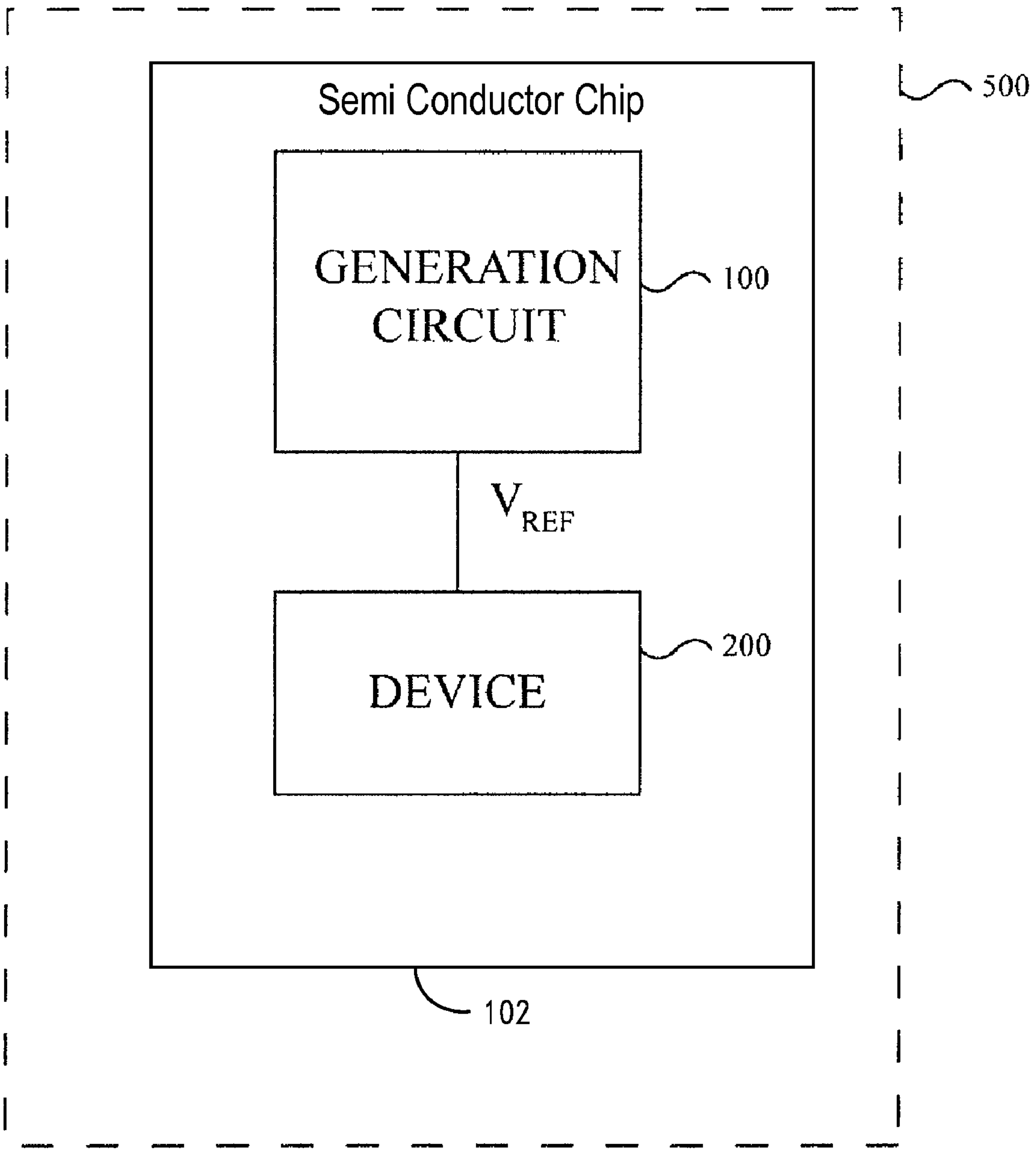
FIG. 1 schematically illustrates an electronic system including a voltage reference generation circuit.

FIG. 1 shows an electronic system 500 including a voltage reference generation circuit 100 and an electronic device 200. Particularly, the voltage reference generation circuit 100 is configured to generate on a respective terminal a reference voltage $V_{REF}$ to be fed to the electronic device 200. As an example, the electronic device 200 may be an analog-to-digital converter, a digital-to-analog converter, a linear or switching voltage regulator, a current generator or another type of device which employs a reference voltage. The voltage reference generation circuit 100 and the electronic device 200 can be integrated in a single semiconductor chip 102 or can be integrated in separated and electrically interconnected chips. For the present description, blocks, devices and components having the same or analogous structure or function are indicated in the drawings by the same reference numbers.

Figure 2:
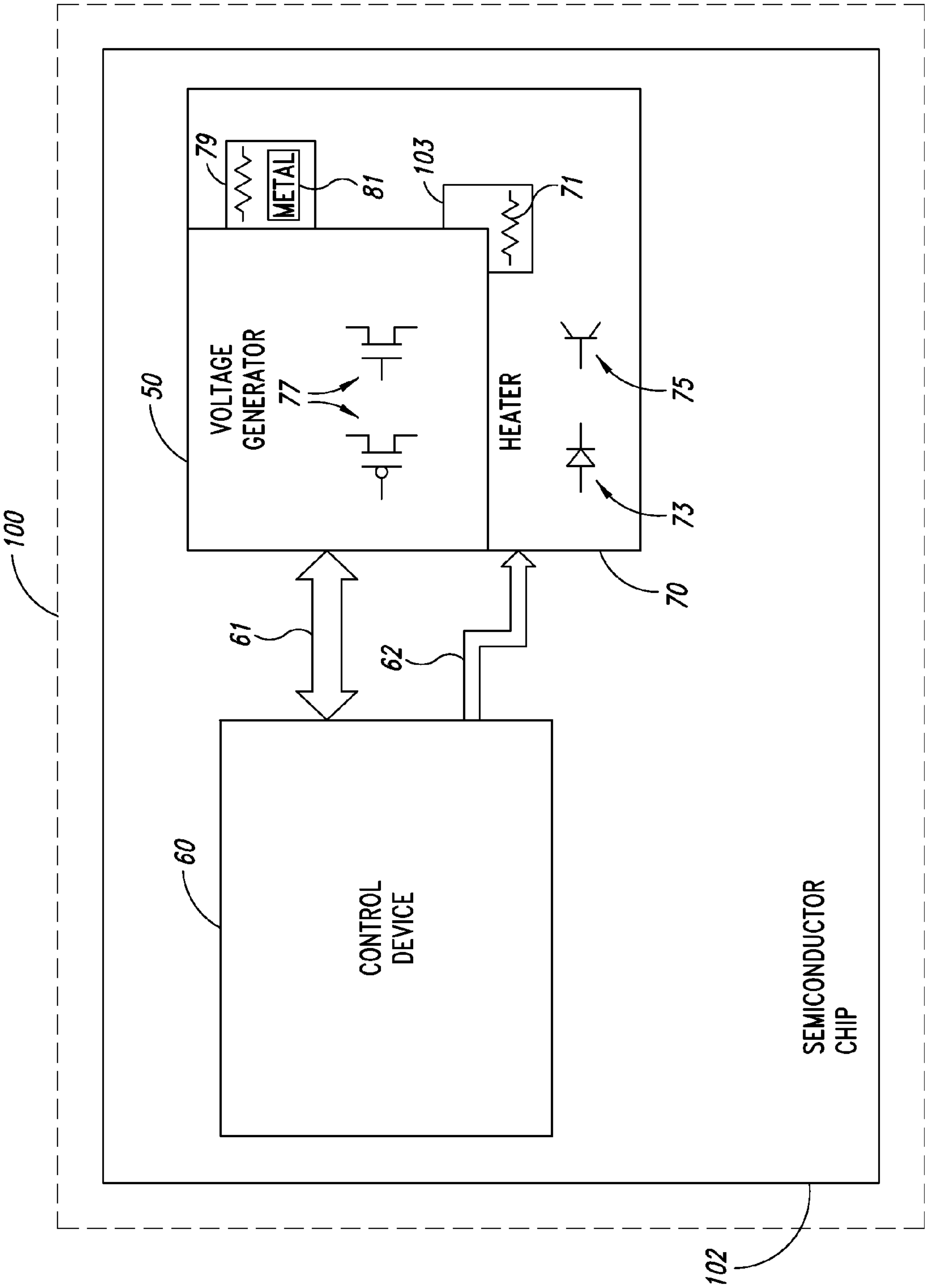
FIG. 2 schematically illustrates an embodiment of said voltage reference generation circuit.

FIG. 2 shows an embodiment of the voltage reference generation circuit 100 comprising a voltage generator 50, a control device 60 an heater 70. The control device 60 is configured to exchange digital signals on a bus 61 with the voltage generator 50 to execute a calibration process. Particularly, the voltage generator 50 is a band-gap voltage reference circuit and, as an example, is integrated the same chip in which the control device 60 can be integrated.

Figure 3:
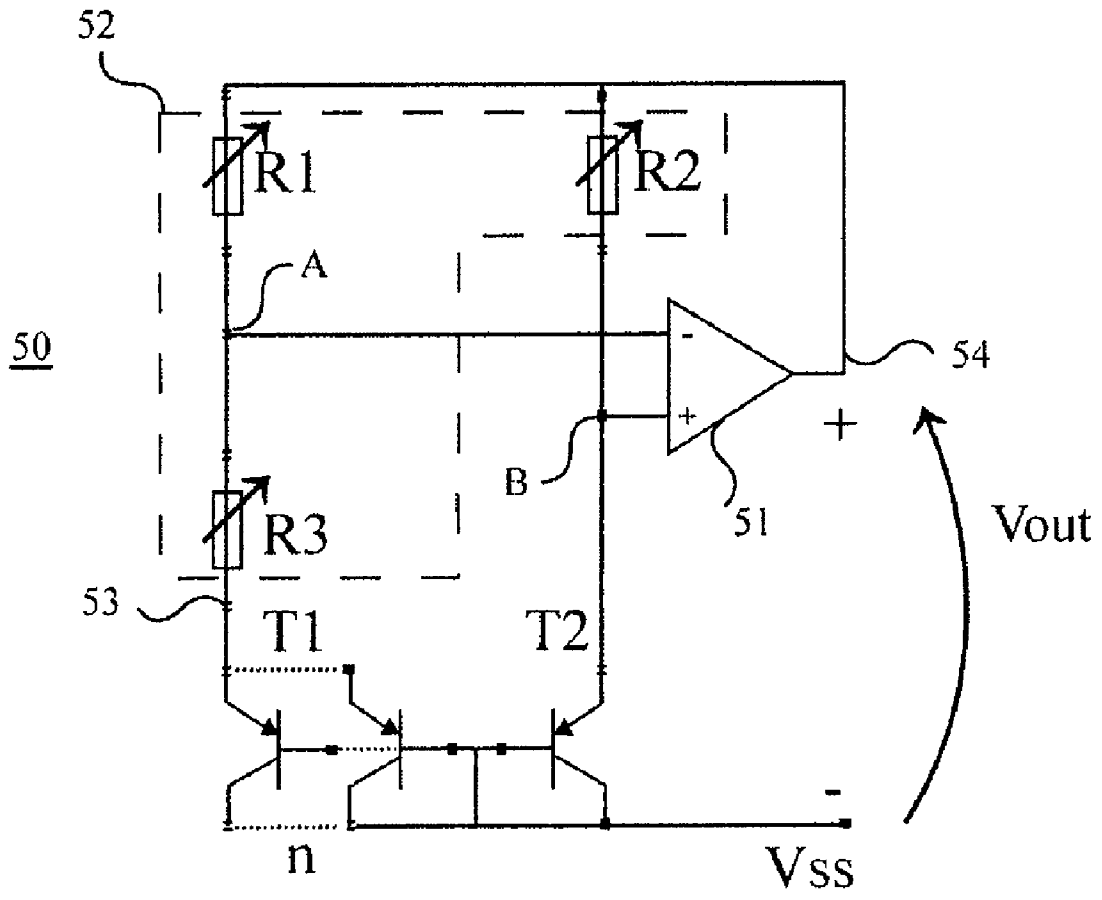
FIG. 3 is an example of band-gap voltage reference generator circuit.

An example of the band-gap voltage reference circuit 50 is schematically illustrated in FIG. 3. The band-gap voltage reference circuit 50 includes a plurality of n first transistors T1, a second transistor T2, an operational amplifier 51 and a multiplier 52. In accordance with the shown example, the first transistors T1 and the second transistor T2 are bipolar transistors, particularly, of the PNP type. The first transistors T1 have respective emitter terminals connected to a terminal 53 of the multiplier 52. Collector terminals of the first transistors T1 are connected to a voltage terminal Vss. The second transistor T2 shows an emitter terminal connected to a positive input + of the operational amplified 51 and a collector terminal connected to the voltage terminal Vss. Base terminals of first transistors T1 and the second transistor T2 are connected to the voltage terminal Vss. The first transistors T1 and the second transistor T2 are connected in the diode configuration and are configured to produce different current densities and therefore they have different base-emitter voltages.

The operational amplifier 51 comprises, further to the positive input +, a negative input − and an output 54 representing a positive terminal for a generated output voltage $V_{out}$. The operational amplifier 51 keeps substantially equal the voltages at a first node A and a second node B, respectively connected to the negative and positive inputs of the operational amplifier 51. Multiplier 52 includes a first resistor R1, a second resistor R2 and a third resistor R3. At least one of the resistors R1-R3 of the multiplier 52 can be trimmed or adjusted in accordance with a digital signal provided by the control device 60.

First resistor R1 is connected between the output 54 of the operational amplifier 51 and the first node A, while second resistor R2 is connected between the output 54 and the second node B. Third resistor R3 is connected between the first node A and the terminal 53 of the multiplier 52. At least one of the resistors R1-R3 included in multiplier 52 can comprise resistance elements (not shown) connected in a cascade configuration and provided with respective short-circuit switches (e.g., further transistors) so as to allow adjusting of their resistance values. The short-circuit switches can be activated or deactivated by corresponding digital signals provided by the control device 60 and forming a digital word setting the behavior of multiplier 52. Alternatively or in addition to resistance elements, multiplier 50 can comprise capacitance elements.

The band-gap voltage reference circuit 50 operates by balancing a negative temperature coefficient of a pn junction with a positive temperature coefficient of the thermal voltage, $V_{th}=k_B T/q$, where $k_B$ is the Boltzmann's constant and q the electron's charge. In operation, the plurality of n first transistors T1 connected in parallel shows a base-emitter voltage $V'_{BE}$ and the second transistor T2 shows a corresponding base-emitter voltage $V_{BE}$, different from $V'_{BE}$. Considering that the voltage at the first node A is equal to the one at the second node B, on the third resistor R3 a voltage $\Delta V_{BE}=V_{BE}-V'_{BE}$ is applied.

The values of the resistances of the first resistor R1, the second resistor R2 and the third resistor R3 can be chosen so as to obtain a same value of an electrical current circulating in the first resistor R1 and in the second resistor R2. However, said resistance values can be chosen to obtain any specific ratio between the electrical current circulating in the second resistor R2 and the one circulating in the first resistor. The resistance values of the first resistor R1, the second resistor R2 and the third resistor R3 set multiplier factors characterizing the function of the multiplier 52.

The behavior of output voltage Vout can be expressed by the following relation:

$$Vout=M_1 V_{BE}+M_2\Delta V_{BE}$$

wherein:

$M_1$ and $M_2$ are adjustable multiplier factors due to the action of the multiplier 52.

The adjustable multiplier factors $M_1$ and $M_2$ can be expressed as:

$$M_1=(m_1+K_1A_1),$$

$$M_2=+(m_2+K_2A_2)$$

wherein $m_1$, $m_2$ (real numbers) are fixed components of the multiplier factors associated with the multiplier 52;

$K_1$, $K_2$ (integer numbers expressed by n bits) are calibration parameters which define a calibration word;

$A_1$, $A_2$ (real numbers) represent amplitudes of the calibration effect.

Therefore, $K_1 A_1$ and $K_2 A_2$ represent variable components of the multiplier factors $M_1$ and $M_2$ which can be adjusted by modifying two digital words provided by the control device 60 so as to adjust the resistances associated to one or more of the resistors included in the multiplier 52.

It has to be observed that alternatively to the band-gap voltage reference circuit 50 illustrated in FIG. 3 other types of band-gap circuits can be used such as band-gap voltage reference circuits having different electrical circuital topologies. The band-gap voltage reference circuit 50 can be integrated in a semiconductor chip (see FIG. 2) in accordance with, as an example, a bipolar integration technology or can be manufactured in a CMOS (Complementary Metal Oxide Semiconductor) (see FIG. 2) technology in which pn junctions are made in order to ensure the voltage versus temperature behavior typical of the band-gap voltage reference circuits.

With further reference to FIG. 2, heater 70 is configured to locally heat the band-gap voltage reference circuit 50 and can be activated or deactivated by the control device 60. Heater 70 allows to generate heat in accordance with the Joule effect and is employed during the calibration process of the band-gap voltage reference circuit 50. Heater 70 can comprise one or more integrated heating electronic components such as: resistors, such as illustrated resistors 71, 79, diodes, such as the illustrated diode 73, and/or transistors, such as the illustrated diode 75. As illustrated, the band-gap voltage reference circuit 50 includes one or more CMOS transistors 77.

As an example, the integrated heating resistors, such as the illustrated resistor 71, can be obtained by a diffusion process in an area 103 of the chip 102 surrounding the region in which the band-gap voltage reference circuit 50 is integrated. Alternatively, the integrated heating resistors, such as the illustrated resistor 79, of the heater 70 can be manufactured by metal layers, such as the illustrated metal layer 81, laying in a metal level of the semiconductor chip in which the band-gap voltage reference circuit 50 is integrated. According to the example depicted in FIG. 2, heater 70 is connected to the control device 60 by a command line 62.

Figure 4:
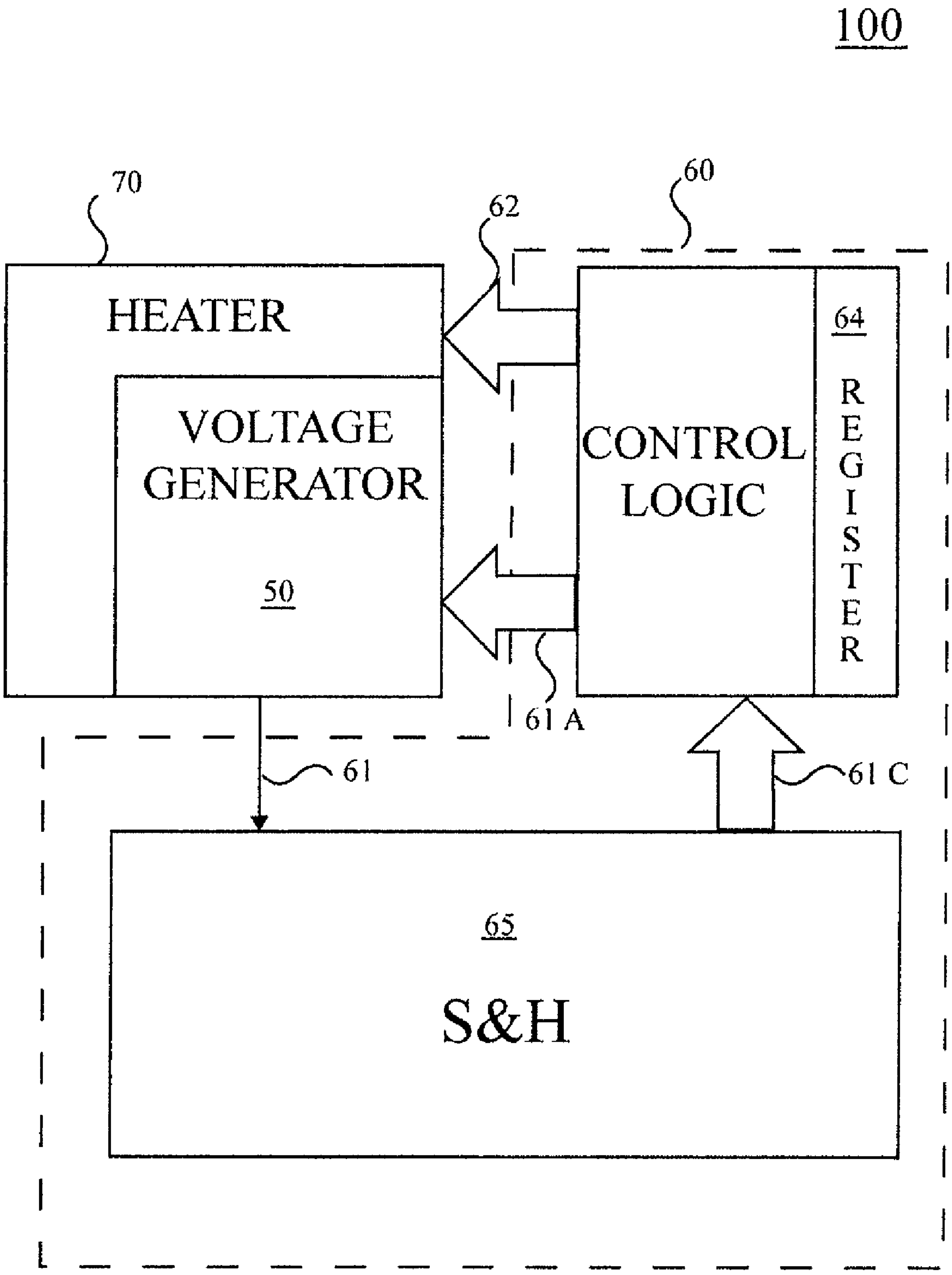
FIG. 4 illustrates said voltage reference generation circuit including a control device in accordance with a first embodiment.

FIG. 4 shows schematically a first embodiment of the voltage reference generation circuit 100 in which the control device 60 comprises a control logic 63, a register 64, and a sample and hold device 65. The control logic 63 is configured to send command signals to the heater 70 on the command line 62 and calibration signals carrying the calibration words to the band-gap voltage reference circuit 50 on a calibration bus 61A. Moreover, control logic 63 is configured to receive by a bus 61C samples representing the voltage generated by the band-gap voltage reference circuit 50. The control logic 63 can be implemented by a combinatory network and/or by a sequential network and operates according to a suitable algorithm in order to chose the calibration words that minimize variations with temperature of the voltage generated by the band-gap voltage reference circuit 50.

The sample and hold device 65 is configured to receive a voltage signal generated by the band-gap voltage reference circuit 50 and sampling it so as to obtain corresponding samples to be sent to the control logic 63. The sample and hold device 65 can be realized in a known manner by using analogical components such as comparators and capacitors.

With reference to the calibration process, the control device 60, actives the heater 70 to heat the band-gap voltage reference circuit 50 and receives samples corresponding to the generated voltages at different temperatures. On the basis of said samples, the control device 60 valuates the calibration word K1, K2 according to a calibration criteria and sets accordingly the multiplier factors of multiplier 52.

Figure 5:
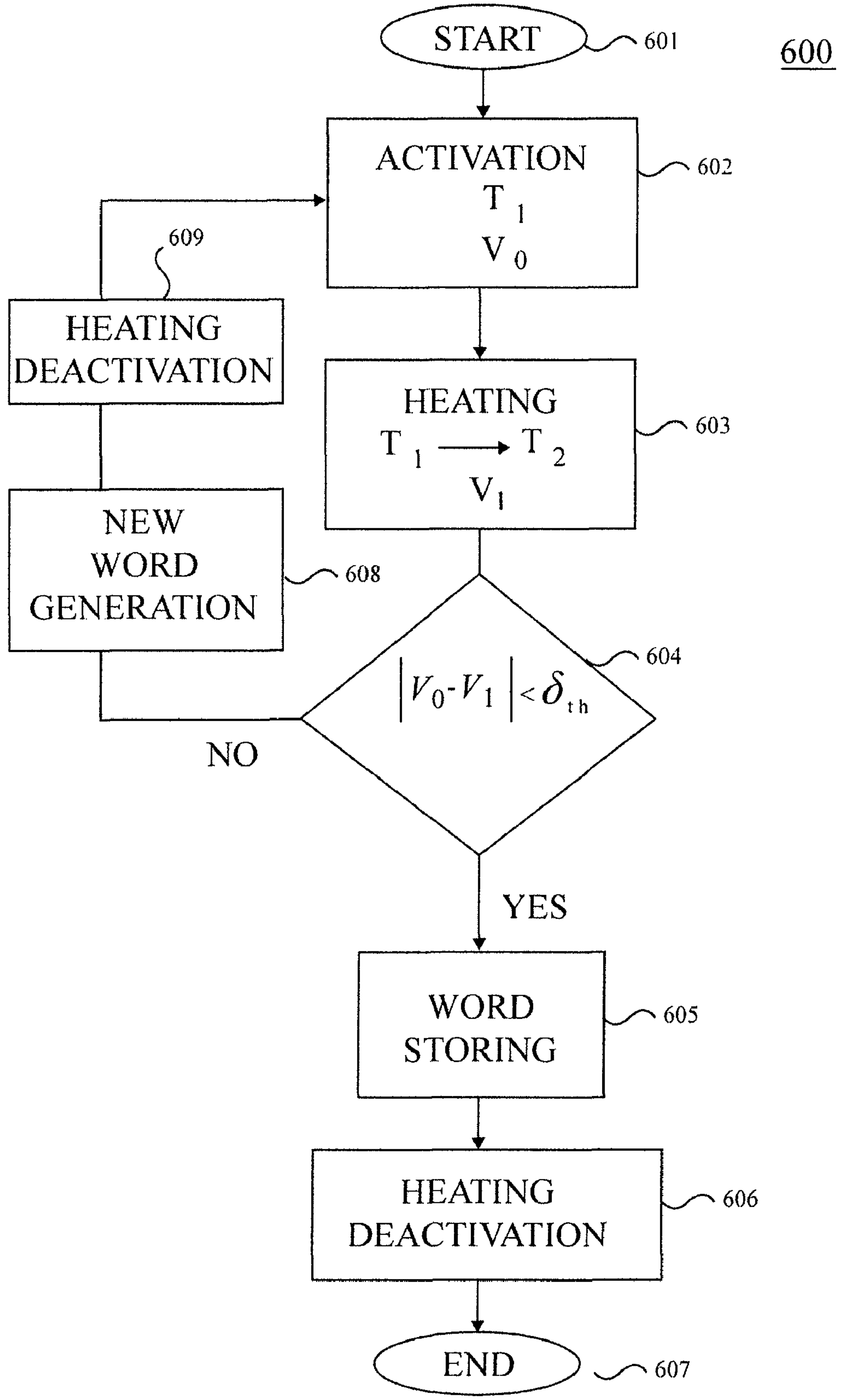
FIG. 5 shows a particular calibration method, through a flowchart.

Referring now to FIG. 5, there is illustrated a flow chart representing a calibration method 600 which can be implemented by the generation circuit 100 of FIG. 4. After a START step 601, the control logic 63 activates the band-gap voltage reference circuit 50 (activation step 602) and keeps in a deactivated status the heater 70. In this situation, the calibration word $K_1$, $K_2$ is set to a first trimming word $K_{1-0}$, $K_{2-0}$, stored in the register 64, and the band-gap voltage reference circuit 50 assumes a first temperature $T_1$, such as the environmental temperature. The band-gap voltage reference circuit 50 generates a first voltage signal $V_0$ which is sampled by the sample and hold device 65. At least a sample corresponding to first voltage signal $V_0$ is then provided to the control logic 63.

In a heating step 603, the control logic 63 activates the heater 70 and the band-gap voltage reference circuit 50 assumes a second temperature value $T_2$, included in an operation range of the band-gap voltage reference circuit 50. As an example, the second temperature values $T_2$ is 20-30° C. greater than the first temperature value $T_1$. Throughout the first heating step 603, the calibration word $K_1$, $K_2$ is maintained equal to the first trimming word $K_{1-0}$, $K_{2-0}$. The band-gap voltage reference circuit 50 generates a second voltage signal $V_1$ which is sampled by the sample and hold device 65. At least a sample corresponding to the second voltage signal $V_1$ is then provided to the control logic 63.

In a comparing step 604, the control logic 63 compares the samples corresponding to the first voltage signal $V_0$ and the second voltage signal $V_1$. If the absolute difference $\delta=|V_0-V_1|$ is lower than a threshold value $\delta_{th}$—as an example, the threshold value is 1 mV—the first trimming word $K_{1-0}$, $K_{2-0}$ is chosen as calibration word (YES branch) and is stored in the register 64 (word storing step 605). The chosen calibration word will be used to set the multiplier factors $M_1$ and $M_2$ of the multiplier 52 throughout normal operation of the voltage reference generation circuit 100. The control logic 63 deactivates the heater 70 (heating deactivation step 606) and the generation circuit 100 can be employed as needed in the system 500 (FIG. 1). The calibration process ends in an end step 607. Preferably, the control logic 63 generates a calibration signal which indicates that the calibration process is terminated.

If in the comparing step 604 it is noticed that the absolute difference δ is greater than the threshold value (NO branch), the control logic 63 generates another trimming word $K_{1-1}$, $K_{2-1}$ (new word generation step 608) which is provided to the multiplier 52 during another calibration cycle in which activation step 602, heating step 603 and comparison step 604 are repeated. Before evaluating the voltage generated at the first temperature $T_1$ for the other trimming word $K_{1-1}$, $K_{2-1}$, the heater 70 is deactivated in a deactivation step 609.

The iterative calibration process 600 terminates when a trimming word ensuring an absolute difference δ of the voltages at the two temperatures lower than the threshold value is found.

Figure 6:
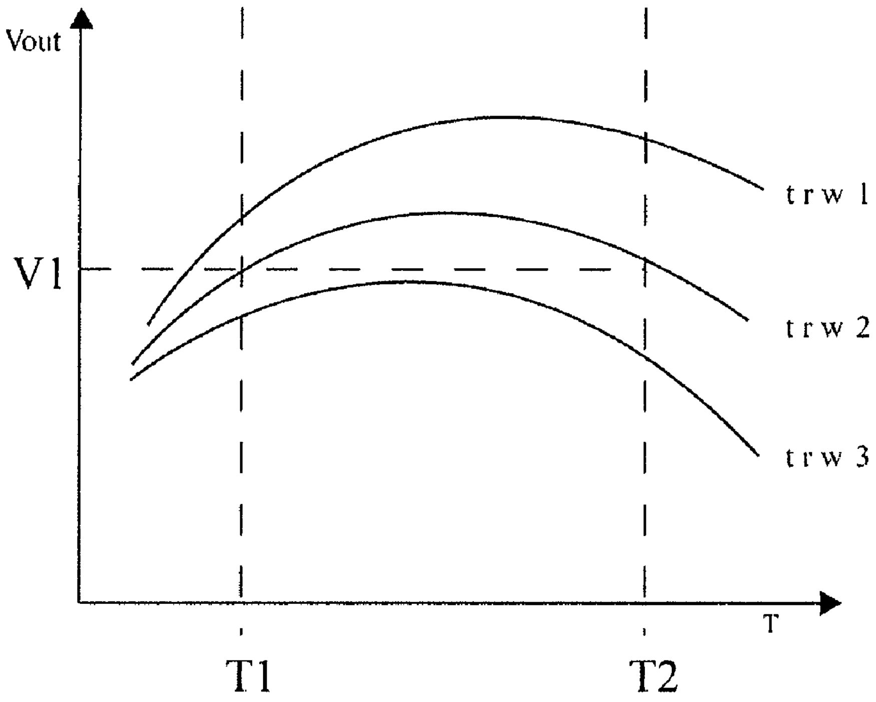
FIG. 6 shows exemplary temperature behaviors of the band-gap voltage reference generator circuit.
Figure 8:
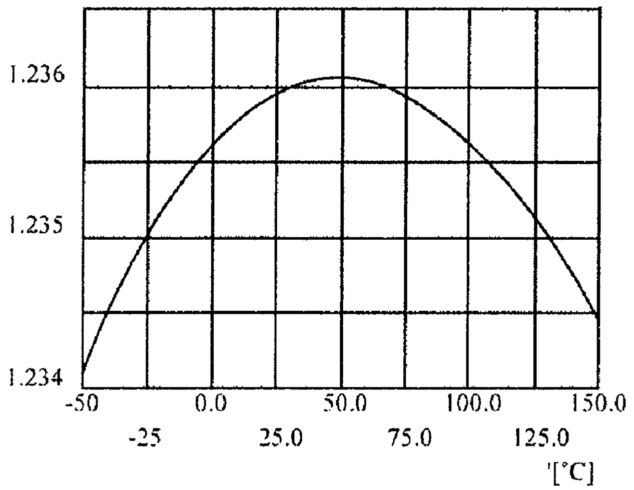
FIG. 8 an exemplary voltage versus temperature curve of a typical band-gap voltage reference.

With reference to the criteria used in the calibration process 600, FIG. 6 shows exemplarily a diagram of the voltage Vout generated by the band-gap voltage reference circuit 50 versus the temperature T for three different trimming words: a first trimming word trw1, a second trimming word trw2 and a third trimming word trw3. FIG. 6 shows the three curves associated with each trimming words. As clear from the example of FIG. 6, the voltage behavior obtained for the second trimming word trw2 minimizes the difference δ between the voltage values at the first temperature $T_1$ and the second temperature $T_2$: the voltage is about equal to V1 at both temperatures.

The Applicants have observed that choosing a trimming word which minimizes the above defined difference δ allows to state that the band-gap voltage reference circuit 50 will work on the suitable voltage-temperature curve and therefore said circuit is corrected calibrated. Indeed, considering a voltage Vout satisfying the following conditions of the Rolle Theorem:

$$\text{Vout}:[T_1,T_2]\rightarrow R$$

Vout shows a continuous behavior;

Vout is derivable in the range $[T_1, T_2]$;

$$Vout(T_1)=Vout(T_2);$$

it can be stated that there is a value $T_M$ of temperature T included in the range $[T_1, T_2]$ for which the voltage Vout shows a maximum or a minimum, the derivative on Vout is null: $V\alpha(T_M)=0$. Therefore, by choosing the temperature values $T_1$ and $T_2$ sufficiently distant (e.g., temperature difference of 20-30° C.) and included in range of operation of the band-gap voltage reference circuit 50, the vertex of the curve voltage-temperature is included in such temperature range and said circuit 50 is calibrated.

Figure 7:
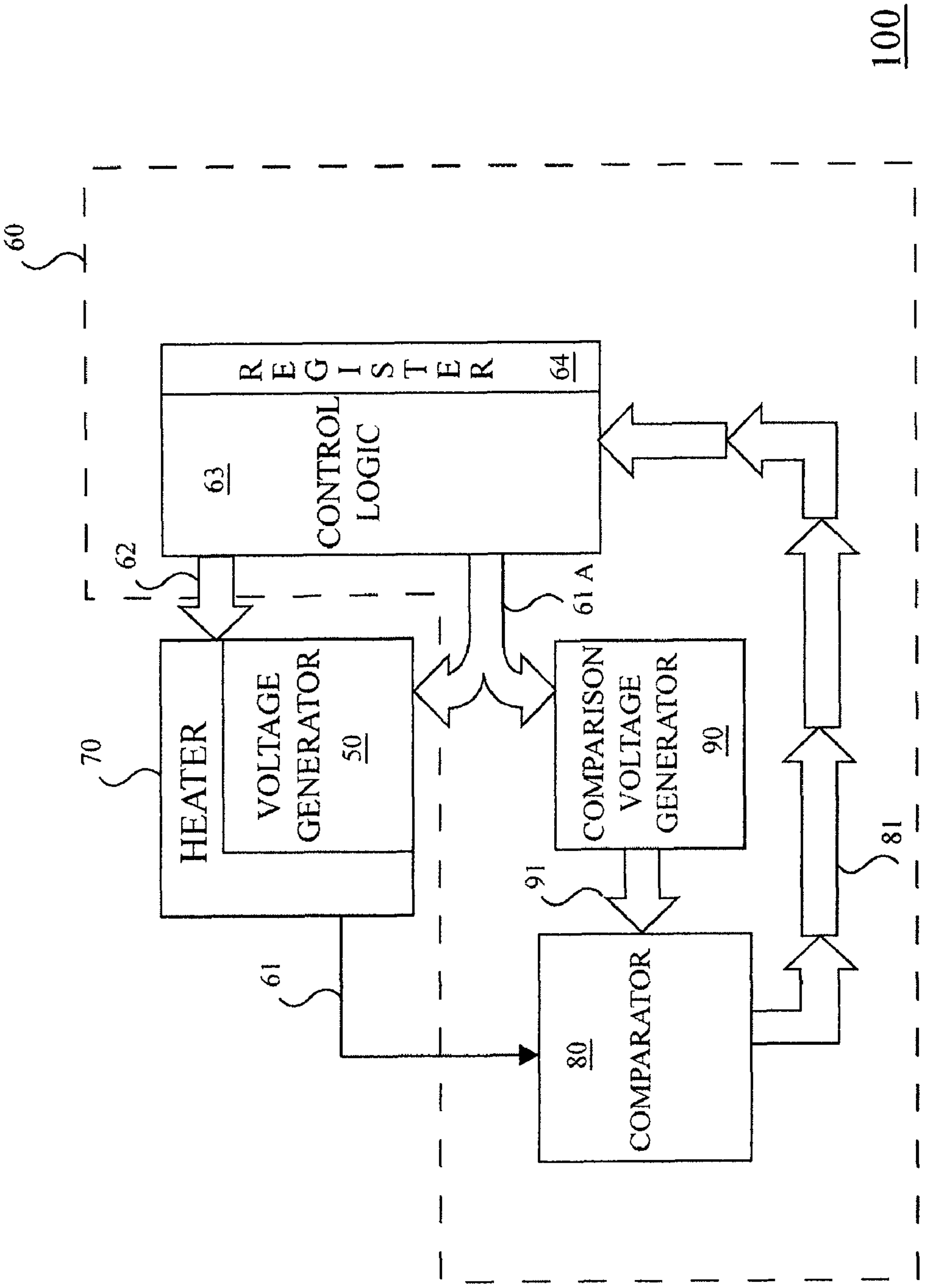
FIG. 7 illustrates said voltage reference generation circuit including a control device in accordance with a second embodiment.

FIG. 7 shows a second embodiment of the voltage reference generation circuit 100 wherein the control device 60 is different from the one depicted in FIG. 4 and includes the control logic 63, the register 64, a comparator 80 and a comparison voltage generator 90. The comparison voltage generator 90 is a generation circuit identical or substantial identical to the voltage generator circuit 50 and, in particular, is a further band-gap voltage reference circuit. The comparison voltage generator 90 can be activated and deactivated by the control logic 63 and, according to the example described, is not heated during the calibration process. Particularly, the comparison voltage generator 90 is thermally isolated from said heater 70.

The comparator 80 can be realized in a traditional manner by using analogical components and is activated by the control logic 63 during the comparison process to compare the voltage signal provided by the voltage generator circuit 50 with the one provided on a bus 91 by the comparison voltage generator 90. The comparator 80 is configured to send on a line 81 towards the control logic 63 a comparison signal representing the comparison results, such as the above voltage difference δ.

The calibration process performed by the voltage reference generation circuit 100 shown in FIG. 7 is analogous to the process 600 above described. In particular, in the calibration process the voltage values at greater temperatures (e.g., temperature $T_2$) are provided by the voltage generator circuit 50 suitably heated and the voltage values at lower temperatures (e.g., temperature $T_1$) are provided by the comparison voltage generator 90. In the control logic 63 is performed the comparison of the voltage difference δ with the threshold $\delta_{th}$.

As an example, the voltage reference generation circuit 100 of FIG. 4 and the one of FIG. 7 can be alternatively used basing the choice on the fact that one or more of their blocks (e.g., the sample and hold device 65 or the comparator 80) are also employed by the electronic device 200 (FIG. 1) and therefore they can be used not only to the purpose of the calibration process. Furthermore, it has to be noticed that the heater 70 is used only in some steps of the calibration process which lasts, as an example, less than 1 ms. Therefore, the power consumption associated with the use of the heater 70 is negligible.

The voltage reference generation circuit 100 can be calibrated at any switching on of the system 500 so as the calibration process 600 allows to compensate the voltage generation dependence on the temperature also taking into account the characteristic and performance variations occurring in the voltage generator circuit 50 during its life.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheetare incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage reference generation system comprising:

a voltage generator integrated in a semiconductor chip and structured to generate an output voltage in accordance with a calibration parameter;

a heater configured to heat said voltage generator; and a controller configured to receive said output voltage, activate said heater and provide said calibration parameter to the voltage generator.

2. The system according to claim 1, wherein said controller is configured to activate the heater during calibration of the voltage generator and keep the heater in an inactive status throughout operation of the voltage reference generation system.

3. The system according to claim 1, wherein said controller includes:

a control logic configured to evaluate said calibration parameter based on temperature values assumed by said voltage generator, corresponding behavior of the output voltage and a calibration criterion.

4. The system according to claim 3, wherein said controller further comprises:

a sample and hold device structured to receive said output voltage from the voltage generator and provide to the control logic samples representative of the output voltage.

5. The system according to claim 3, wherein said controller further comprises:

a comparison voltage generator integrated in the semiconductor chip and structured to generate a comparison output voltage; the comparison voltage generator being thermally isolated from said heater.

6. The system according to claim 5, wherein the controller further includes:

a comparator configured to receive said output voltage and said comparison voltage and provide a comparison signal to be supplied to the control logic.

7. The system according to claim 6 wherein said control logic is configured to evaluate the calibration parameter so as to minimize a difference between the output voltage and the comparison voltage assumed at different temperature values.

8. The system according to claim 3, wherein said control logic is configured to provide the calibration parameter in a form of a digital word.

9. The system according to claim 8, wherein the controller further comprises a register configured to store said digital word.

10. The system according to claim 8, wherein said control logic is configured to generate trimming digital words to be provided to the voltage generator during calibration of the system.

11. The system according to claim 3, wherein said control logic is configured to evaluate the calibration parameter so as to minimize a difference between values of the output voltage assumed at different temperature values.

12. The system according to claim 1, wherein said heater is integrated into the semiconductor chip and is structured to generate heat by Joule effect.

13. The system according to claim 12, wherein said heater comprises at least one of:

a resistor;

a diode; and a transistor.

14. The system according to claim 12, wherein said heater comprises at least a resistor diffused in said semiconductor chip.

15. The system according to claim 12, wherein said heater is a metallic resistor and comprises a metal layer.

16. The system according to claim 1 wherein said heater is integrated in said semiconductor chip.

17. The system according to claim 1, wherein said voltage generator is band-gap voltage reference circuit.

18. The system according to claim 17, wherein said voltage generator includes:

an electronic circuit structured to generate a first voltage and comprising:

a first transistor, and a second transistor; and a multiplier to multiplier said first voltage and configurable by said calibration parameter to compensate voltage variations due to temperature.

19. The system according to claim 18, wherein said multiplier includes electronic components adjustable based on said calibration parameter.

20. The system according to claim 1 wherein at least part of the controller is integrated in the semiconductor chip.

21. The system of claim 1 wherein the heater is thermally coupled to the voltage generator.

22. An electronic system comprising:

a voltage reference generator integrated in a semiconductor chip and structured to generate an output voltage in accordance with a calibration parameter;

a heater configured to heat said voltage reference generator;

a controller configured to receive said output voltage, activate said heater and provide said calibration parameter to the voltage reference generator;

an electronic device coupled to said output voltage.

23. The electronic system of claim 22, wherein said electronic device comprises at least one of:

an analog-to-digital converter;

a digital-to-analog converter;

a linear voltage regulator;

a switching voltage regulator; and a current generator.

24. The electronic system of claim 22, wherein said controller is configured to activate the heater during calibration of the voltage reference generator and keep the heater in an inactive status throughout operation of the voltage reference generator.

25. The electronic system of claim 22, wherein said heater is integrated in the semiconductor chip and structured to generate heat in accordance with the Joule effect.

26. The electronic system of claim 25, wherein said heater comprises at least one of:

a resistor;

a diode; and a transistor.

27. The electronic system of claim 22, wherein said voltage reference generator is band-gap voltage reference circuit.

28. The electronic system of claim 27, wherein said band-gap voltage reference circuit includes bipolar transistors.

29. The electronic system of claim 27, wherein said band-gap voltage reference circuit includes CMOS transistors.

30. The electronic system of claim 27 wherein the voltage reference generator includes:

an electronic circuit structured to generate a first voltage and comprising:

a first transistor, and a second transistor; and a multiplier to multiplier said first voltage and configurable by said calibration parameter to compensate voltage variations due to temperature.

31. The electronic system of claim 30, wherein said multiplier includes electronic components adjustable based on said calibration parameter.

32. The electronic system of claim 22 wherein the controller is configured to provide the calibration parameter in a form of a digital word.

33. The electronic system of claim 22 wherein said heater is integrated in said semiconductor chip.

34. The electronic system of claim 22 wherein at least part of the controller is integrated in the semiconductor chip.

35. The electronic system of claim 22 wherein the electronic device is integrated in the semiconductor chip.

36. The electronic system of claim 22, wherein said controller comprises:

a control logic configured to evaluate said calibration parameter based on temperature values assumed by said voltage reference generator, corresponding behavior of the output voltage and a calibration criterion; and a sample and hold device structured to receive said output voltage from the voltage reference generator and provide to the control logic samples representative of the output voltage.

37. The electronic system of claim 22 wherein the heater is thermally coupled to the voltage reference generator.

* * * * *